United States Patent
Sunaga et al.

(10) Patent No.: US 9,755,343 B2
(45) Date of Patent: Sep. 5, 2017

(54) PLATED MEMBER AND PLATED TERMINAL FOR CONNECTOR

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Takahiro Sunaga, Yokkaichi (JP); Yoshifumi Saka, Yokkaichi (JP); Yasushi Saitou, Yokkaichi (JP)

(73) Assignees: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 264 days.

(21) Appl. No.: 14/390,108

(22) PCT Filed: Dec. 20, 2012

(86) PCT No.: PCT/JP2012/083055
§ 371 (c)(1),
(2) Date: Oct. 2, 2014

(87) PCT Pub. No.: WO2013/150690
PCT Pub. Date: Oct. 10, 2013

(65) Prior Publication Data
US 2015/0079422 A1   Mar. 19, 2015

(30) Foreign Application Priority Data

Apr. 6, 2012 (JP) .................................. 2012-086957
Aug. 29, 2012 (JP) .................................. 2012-188457

(51) Int. Cl.
*H01R 13/03* (2006.01)
*H01R 43/16* (2006.01)
(Continued)

(52) U.S. Cl.
CPC ............. *H01R 13/03* (2013.01); *B32B 15/01* (2013.01); *B32B 15/018* (2013.01); *C22C 5/06* (2013.01);
(Continued)

(58) Field of Classification Search
CPC ..... C23C 28/023; C23C 14/16; C23C 14/165; C23C 14/58; C23C 14/5806;
(Continued)

(56) References Cited

U.S. PATENT DOCUMENTS 6,207,035 B1   3/2001   Adler
6,495,001 B2   12/2002  Adler
(Continued)

FOREIGN PATENT DOCUMENTS

DE   19752329 A1   11/1997
EP    2139012 A1   12/2009
(Continued)

OTHER PUBLICATIONS

German Office Action Dated Dec. 5, 2016.

*Primary Examiner* — Michael E La Villa
(74) *Attorney, Agent, or Firm* — Gerald E. Hespos; Michael J. Porco; Matthew T. Hespos

(57) ABSTRACT

It is aimed to provide a plated member and a plated terminal for connector, to which a large current can be applied and which have both a low friction coefficient and high heat resistance, at low cost and provide a method for producing such a plated member and a method for producing such a plated terminal for connector. A silver-tin alloy layer for coating a surface of a base material made of copper or
(Continued)

copper alloy and a silver coating layer for coating the silver-tin alloy layer and to be exposed on an outermost surface are simultaneously formed by heating to obtain a plated member after tin and silver plating layers are alternately laminated on the surface of the base material with the outermost surface formed by the silver plating layer.

6 Claims, 4 Drawing Sheets

(51) Int. Cl.
*B32B 15/01* (2006.01)
*C23C 28/00* (2006.01)
*C25D 5/10* (2006.01)
*C25D 5/50* (2006.01)
*C25D 5/12* (2006.01)
*C23C 14/16* (2006.01)
*C23C 14/58* (2006.01)
*C23C 28/02* (2006.01)
*C23C 30/00* (2006.01)
*C22C 5/06* (2006.01)

(52) U.S. Cl.
CPC ............ *C23C 14/16* (2013.01); *C23C 14/165* (2013.01); *C23C 14/58* (2013.01); *C23C 14/5806* (2013.01); *C23C 28/00* (2013.01); *C23C 28/02* (2013.01); *C23C 28/021* (2013.01); *C23C 28/023* (2013.01); *C23C 30/00* (2013.01); *C23C 30/005* (2013.01); *C25D 5/10* (2013.01); *C25D 5/12* (2013.01); *C25D 5/50* (2013.01); *H01R 43/16* (2013.01); *Y10T 428/1291* (2015.01); *Y10T 428/12708* (2015.01); *Y10T 428/12715* (2015.01); *Y10T 428/12722* (2015.01); *Y10T 428/12896* (2015.01); *Y10T 428/2495* (2015.01); *Y10T 428/24942* (2015.01); *Y10T 428/24967* (2015.01); *Y10T 428/24975* (2015.01); *Y10T 428/26* (2015.01); *Y10T 428/263* (2015.01); *Y10T 428/264* (2015.01); *Y10T 428/265* (2015.01)

(58) Field of Classification Search
CPC ....... C23C 28/021; C23C 28/02; C23C 28/00; C23C 30/00; C23C 30/005; B32B 15/01; B32B 15/018; B32B 15/04; B32B 15/043; Y10T 428/12896; Y10T 428/12708; Y10T 428/12715; Y10T 428/12722; Y10T 428/1291; Y10T 428/264; Y10T 428/265; Y10T 428/263; Y10T 428/26; Y10T 428/24942; Y10T 428/2495; Y10T 428/24967; Y10T 428/24975; C22C 5/06
See application file for complete search history.

(56) References Cited

U.S. PATENT DOCUMENTS

| | | |
|---|---|---|
| 2001/0004048 A1 | 6/2001 | Adler |
| 2003/0091855 A1 | 5/2003 | Tanaka et al. |
| 2005/0037229 A1 | 2/2005 | Tanaka |
| 2010/0163276 A1 | 7/2010 | Yamaguchi et al. |
| 2010/0186993 A1 | 7/2010 | Yamaguchi |

FOREIGN PATENT DOCUMENTS

| | | |
|---|---|---|
| JP | 01-306574 | 12/1989 |
| JP | 11-222659 | 8/1999 |
| JP | 2003-171790 | 6/2003 |
| JP | 2005-353542 | 12/2005 |
| JP | 2008-050695 | 3/2008 |
| JP | 2008-270192 | 11/2008 |
| JP | 2009-079250 | 4/2009 |
| JP | 4372835 | 11/2009 |
| JP | 2010-138452 | 6/2010 |
| WO | 2009123144 | 10/2009 |

PLATED MEMBER AND PLATED TERMINAL FOR CONNECTOR

BACKGROUND OF THE INVENTION

1. Field of the Invention

The present invention relates to a plated member, a plated terminal for connector, a method for producing a plated member and a method for producing a plated terminal for connector and more particularly to a plated member and a plated terminal for connector containing silver and tin in a plating layer and methods for producing them.

2. Description of the Related Art

In recent years, high-output motors have been used in hybrid vehicles, electric vehicles and the like. Since a large current flows in a connector terminal such as a terminal for high-output motor to which a large current is applied, the amount of heat generation in a terminal portion increases. Further, since the terminal becomes larger in conformity with a current capacity, a larger insertion force is required and damage on a terminal surface during insertion becomes larger. The terminal is inserted and withdrawn a large number of times for maintenance. Connector terminals for large current of this type are required to be heat resistant and abrasion resistant.

Conventionally, connector terminals formed by plating a surface of a base material such as copper or copper alloy such as with tin have been generally used as connector terminals for connecting electric components and the like of automotive vehicles. However, conventional tin plated terminals are insufficient in heat resistance when being used with such a large current. Accordingly, instead of tin plated terminals, silver plated terminals are used as connector terminals used with a large current. Silver has a low electrical resistance value, suppresses a temperature increase when a current is applied, has a high melting point and provides high heat resistance. Further, silver plating has very high corrosion resistance.

However, since copper particles easily diffuse in a silver plating layer, there is a problem that copper components reach a silver plating surface and the oxidized copper components increase resistance in the case of applying silver plating to a surface of a terminal base material made of copper of copper alloy. Further, silver has a property that crystal grains are easily coarsened through recrystallization. If a silver plated terminal is used under a high-temperature environment, hardness is reduced due to the growth of crystal grains. This causes a problem of increasing a terminal insertion force and increasing a friction coefficient.

Accordingly, Japanese Unexamined Patent Publication No. 2009-79250 discloses a copper or copper alloy member in which nickel underplating is applied to a surface of a copper or copper alloy member, a soft silver layer or silver alloy layer with a limited antimony concentration is formed on the nickel under plating, and a hard silver alloy layer containing antimony is formed as an outermost layer on the soft silver layer or silver alloy layer for the purpose of combining hardness and heat resistance.

On the other hand, an attempt to form an alloy of silver and tin and contribute to an improvement of heat resistance and a friction coefficient reduction has also been reported. Publication of Japanese Patent No. 4372835 discloses an electrically conductive member in which an Ni-based underlayer is formed on a copper-based base plate and a Cu—Sn intermetallic compound layer is formed on an Sn—Ag coating layer.

A plurality of plating structures including a silver-tin alloy layer and their producing methods are known although they have purposes different from an improvement of heat resistance and a friction coefficient reduction. For example, Japanese Unexamined Patent Publication No. 2010-138452 discloses to form an Ag3Sn alloy layer by, after forming an Sn layer on a surface of a base material made of Cu or Cu alloy by electroplating, forming an Ag nanoparticle coating layer on this Sn layer by a wet film forming method. Further, Japanese Unexamined Patent Publication No. 2008-50695 discloses to form an Ag—Sn intermetallic compound by forming an Ag thin film on an Sn thin film. Here, an outermost surface is made of the Ag—Sn intermetallic compound.

In the plating layer structure described in each of the above patent literatures, abrasion resistance by the friction coefficient reduction and heat resistance by the suppression of a resistance increase when being left at high temperature are not combined at a sufficient high level as a terminal for large current.

In Japanese Unexamined Patent Publication No. 2009-79250, a main plating layer is the soft silver layer and sufficient abrasion resistance cannot be obtained even if the hard silver layer is formed thereon. Also in the structures of patent literatures 2 to 4, the Ag—Sn alloy is formed on the outermost layer and the abrasion resistance of this alloy is not very high.

Further, in the plating layer of Japanese Unexamined Patent Publication No. 2009-79250, copper atoms diffuse into the silver plating layer due to exposure to a heating environment for a long time and are oxidized on the outermost surface of the plating layer, thereby increasing a surface resistance value. Even if the Ni underplating is formed, it is insufficient to prevent the diffusion of copper atoms from the base material. Further, antimony atoms contained in the hard silver layer also diffuse into the outermost surface and are oxidized to increase the surface resistance value. On the other hand, in Japanese Patent No. 4372835, Japanese Unexamined Patent Publication No. 2010-138452 and Japanese Unexamined Patent Publication No. 2008-50695, if the Ag—Sn alloy formed on the outermost surface is exposed to a heating environment, tin oxide is inevitably formed on the outermost surface to cause high resistance. As just described, in any case, heat resistance is insufficient, i.e. a resistance increase caused by being left at high temperature is not suppressed.

Furthermore, since the hard silver plating is softened by being left in the heating environment in the configuration of Japanese Unexamined Patent Publication No. 2009-79250, heat resistance in the sense of preventing softening caused by being left at high temperature also cannot be obtained.

In addition, since a plating layer is produced by a special film forming method in any of methods of cited literatures 1 to 4, production cost increases.

A problem sought to be solved by the present invention is to provide a plated member and a plated terminal for connector, to which a large current can be applied and which have both a low friction coefficient and high heat resistance, at low cost and to provide a method for producing such a plated member and a method for producing such a plated terminal for connector.

SUMMARY OF THE INVENTION

To solve the above-described problem, a plated member according to the present invention is characterized in that a surface of a base material made of copper or copper alloy is coated with a silver-tin alloy layer, a surface of the silver-tin alloy layer is coated with a silver coating layer and the silver coating layer is exposed on an outermost surface.

An underplating made of nickel or copper may be formed in contact with the surface of the base material and the silver-tin alloy layer is formed on a surface of the underplating.

The silver coating layer is preferably thinner than the silver-tin alloy layer.

Preferably, a thickness of the silver-tin alloy layer is in a range of 1 to 45 μm and that of the silver coating layer is in a range of 0.5 to 15 μm.

A plated terminal for connector according to the present invention is characterized by including any one of the above plated members.

A method for producing a plated member according to the present invention comprises forming a silver-tin alloy layer for coating a surface of a base material made of copper or copper alloy and a silver coating layer for coating the silver-tin alloy layer and to be exposed on an outermost surface by heating after tin and silver plating layers are alternately laminated on the surface of the base material with the outermost surface formed by the silver plating layer.

A nickel under plating layer may be formed in contact with the base material and a lowermost layer of a laminated structure composed of the tin and silver plating layers is the silver plating layer and formed in contact with the nickel under plating layer.

The laminated structure composed of the tin and silver plating layers preferably includes three layers of the silver plating layer as the lowermost layer, the tin plating layer as an intermediate layer and the silver plating layer as an outermost layer. In this case, the silver plating layer as the outermost layer is further preferably thicker than the silver plating layer as the lowermost layer. Further, the silver plating layer as the outermost layer is preferably thicker than the tin plating layer as the intermediate layer.

A thickness of the silver plating layer as the lowermost layer may be in a range of 0.5 to 15 μm, that of the tin plating layer as the intermediate layer may be in a range of 0.5 to 15 μm and that of the silver plating layer as the outermost layer may be in a range of 1 to 30 μm.

The laminated structure composed of the tin and silver plating layers may be heated at a temperature not lower than 180° C. and not higher than a melting point of tin.

A method for producing a plated terminal for connector according to the present invention may comprise forming a silver-tin alloy layer for coating a surface of a base material made of copper or copper alloy and a silver coating layer for coating the silver-tin alloy layer and to be exposed on an outermost surface by heating after alternately laminating tin and silver plating layers on the surface of the base material with the outermost surface formed by the silver plating layer.

According to the plated member according to the present invention, a friction coefficient on a plating surface is suppressed low as compared with the case where the entire plating layer is made of silver and the case where the silver-tin alloy is exposed on the outermost surface since the soft silver coating layer is formed on the hard silver-tin alloy layer.

Even in the case of exposure to a heating environment, no tin oxide is formed on the outermost surface since the silver-tin alloy layer is not exposed on the surface. Furthermore, since the silver-tin alloy layer suppresses the diffusion of copper atoms of the base material to the outermost surface, the formation of copper oxide on the surface is also suppressed. Since these oxides are not formed on the plating outermost surface even in the heating environment, an increase of a contact resistance value is suppressed.

Since the silver-tin alloy layer is hard, the hard plated member is obtained in an initial state and softening is unlikely to occur after being left in the heating environment. As just described, the plated member according to the present invention simultaneously has a low friction coefficient and heat resistance in the sense of both suppressing an increase of the contact resistance value and suppressing softening.

An underplating made of nickel may be formed in contact with the surface of the base material and the silver-tin alloy layer is formed on the nickel underplating, the diffusion of copper atoms from the base material into the plating layer thereabove when being left in the heating environment is further efficiently prevented. This further prevents the diffused copper atoms from being oxidized on the outermost surface of the plating layer and contributing to an increase of contact resistance. On the other hand, if an underplating made of copper is formed in contact with the surface of the base material, adhesion at an interface between the base material and the plating layer is enhanced.

Further, the friction coefficient is reduced and the heat resistance is improved to a higher degree if the silver coating layer is thinner than the silver-tin alloy layer.

Furthermore, if the thickness of the silver-tin alloy layer is in the range of 1 to 45 μm and that of the silver coating layer is in the range of 0.5 to 15 μm, an effect of reducing the friction coefficient and improving the heat resistance is more easily obtained.

According to the plated terminal for connector according to the present invention, insertion and withdrawal performance and heat resistance are excellent and low surface resistance and high hardness are maintained even in use in a heating environment such as when a large current is applied since the plated terminal includes the plated member having both a friction coefficient reduction and an improvement of heat resistance.

According to the method for producing a plated member according to the present invention, the silver-tin alloy layer and the silver coating layer on the outermost surface can be simultaneously formed only by a simple process of alternately laminating the silver and tin plating layers and heating them. This process does not require a special process such as the formation of an alloy plating or a nanoparticle layer and versatile silver plating method and tin plating method can be directly applied in combination. In addition, this process can be performed using a continuous plating line, wherefore production cost of the plated member is reduced.

If the nickel under plating layer is formed in contact with the base material and the silver plating layer as the lowermost layer of the laminated structure composed of the tin and silver plating layers is formed in contact with the nickel under plating layer, high adhesion is obtained between the nickel underlayer and the silver-tin alloy layer.

If the laminated structure composed of the tin and silver plating layers includes three layers of the silver plating layer as the lowermost layer, the tin plating layer as the intermediate layer and the silver plating layer as the outermost layer, production cost of the plated member is further reduced since the number of the layers is suppressed to a minimum level.

If the silver plating layer as the outermost layer is thicker than the silver plating layer as the lowermost layer, the silver coating layer not alloyed with tin is formed with high accuracy on the outermost surface after heating.

If the silver plating layer as the outermost layer is thicker than the tin plating layer as the intermediate layer, the silver plating layer as the outermost layer is not entirely alloyed with tin during heating and the silver coating layer is reliably formed in the outermost layer.

If the thickness of the silver plating layer as the lowermost layer is in the range of 0.5 to 15 µm, that of the tin plating layer as the intermediate layer is in the range of 0.5 to 15 µm and that of the silver plating layer as the outermost layer is in the range of 1 to 30 µm, the formation of the silver-tin alloy layer effectively proceeds during heating and unreacted tin is unlikely to be left. Simultaneously, the unreacted silver coating layer is likely to be left on the surface.

If the laminated structure composed of the tin and silver plating layers is heated at a temperature not lower than 180° C. and not higher than the melting point of tin, the formation of the silver-tin alloy layer slowly proceeds. Thus, the silver-tin alloy layer and the silver coating layer can be formed with high in-plane uniformity and an interface between these layers and the surface of the silver coating layer can be formed to be flat. This enables the formation of a plated member including a good coating layer with a small spatial distribution in the single plated member and a small variation among independently formed plated members with respect to friction coefficient, hardness, contact resistance and heat resistance.

According to the method for producing a plated terminal for connector according to the present invention, the silver-tin alloy layer and the silver coating layer on the outermost surface can be simultaneously formed only by a simple and inexpensive process.

BRIEF DESCRIPTION OF THE DRAWINGS

FIGS. 1(a)-1(d) are schematic diagrams showing plated members and producing methods thereof according to an embodiment of the present invention, wherein FIGS. 1(a) and 1(c) show a state before heating is performed in a production process and FIGS. 1(b) and 1(d) show the plated members obtained after heating in FIGS. 1(a) and 1(c).

FIGS. 3(a)-3(c) show focused ion beam-scanning ion microscope (FIB-SIM) images of a cross-section of a plated member according to Example 1, wherein FIG. 3(a) shows a state before heating is performed and FIGS. 3(b) and 3(c) show a state after heating, and FIG. 3(b) shows a low magnification image and FIG. 3(c) shows a high magnification image.

DETAILED DESCRIPTION (Plated Member and Plated Terminal for Connector)

Figure 1A:
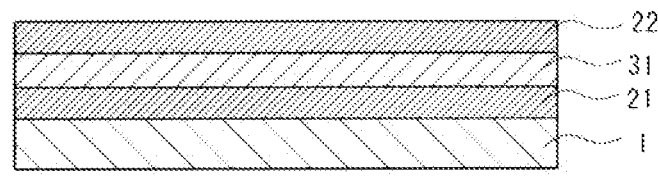
Figure 1B:
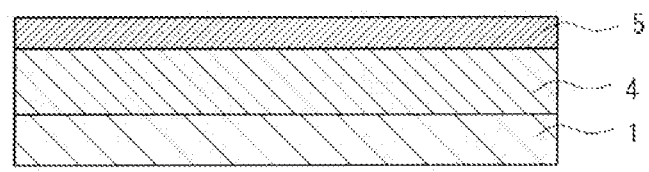
Figure 1C:
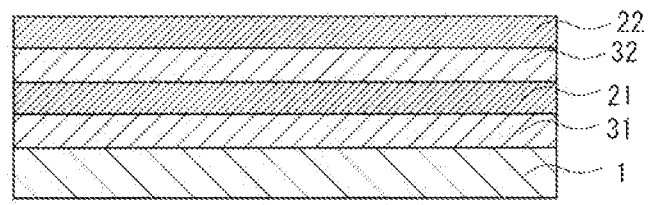
Figure 1D:
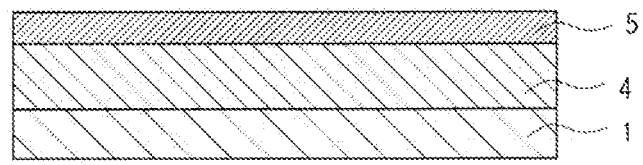

As shown in FIGS. 1(b) and 1(d), a plated member according to the present invention is such that a surface of a base material 1 made of copper or copper alloy is coated with a silver-tin alloy layer 4 and a surface of the silver-tin alloy layer 4 is further coated with a silver coating layer 5.

A plated terminal for connector according to the present invention is formed using the above plated member and includes the above plated member at least at a position where electrical contact is established. Various known terminal shapes can be applied as the shape of the terminal. Since the plated member according to the present invention has high heat resistance and good insertion and withdrawal performance, the plated terminal for connector according to the present invention is suitably formed as a terminal for large current.

The base material 1 constituting the plated member serves as a base plate of the plated member and formed of copper or copper alloy. Further, an underplating made of nickel or nickel alloy is preferably formed on a surface of the base material. This is because the diffusion of copper atoms from the base material into the plating layer is strongly prevented by the presence of the underplating made of nickel or nickel alloy. A thickness of the nickel underplating is desirably in a range of 0.5 to 1 µm in the sense of providing a necessary and sufficient copper atom diffusion preventing capability. Alternatively, if an underplating made of copper is formed on the surface of the base material 1 particularly when the base material 1 is made of copper alloy, adhesion between the base material 1 and the plating layer is increased.

The silver-tin alloy layer 4 is formed on the base material. As described later, this silver-tin alloy layer 4 can be formed by an alloying reaction caused by heating a laminated structure of silver and tin plating layers. The silver-tin alloy layer includes a phase having the composition of Ag4Sn as a main phase.

The silver coating layer 5 is formed on the surface of the silver-tin alloy layer 4 and exposed on an outermost surface of the plated member. The silver coating layer 5 is a layer mainly containing silver and has a property as soft silver. Generally, a silver plating layer whose Vickers hardness is 100 or below 150 is called a soft silver plating layer. Note that, in this specification, a layer mainly containing silver coating the surface of the silver-tin alloy layer is called a "silver coating layer" and a layer made of silver and contained in a silver-tin laminated structure forming such a member after heating is called a "silver plating layer" to be distinguished in the plated member as a completed product as described above.

By forming the silver-tin alloy layer 4 on the base material surface and coating the surface of the silver-tin alloy layer 4 with the silver coating layer 5 made of soft silver in this way, a friction coefficient of the surface is reduced as compared with the case where the plating layer is made of only soft silver and the case where the soft silver plating is formed on a soft silver plating. Generally, a friction coefficient is known to be reduced in the case of forming a soft plating layer on a hard plating layer. A low friction coefficient is thought to be obtained by forming the soft silver layer 5 on the hard silver-tin alloy layer 4.

Further, since the silver-tin alloy layer 4 is very hard, high hardness is obtained for the plated member according to the present invention as a whole.

Furthermore, in the plated member including the plating layer in which the silver-tin alloy layer 4 is coated with the silver coating layer 5 as described above, an increase of a contact resistance value in the case of being left in a heating environment is suppressed as compared with the case where the entire plating layer is formed only of silver plating or only of silver-tin plating. One reason of this is thought to be because the diffusion of copper atoms from the base material 1 and the formation of copper oxide on the plated member surface associated with the diffusion are suppressed by the presence of the silver-tin alloy layer 4. In addition, it is also thought to contribute to the suppression of an increase of the contact resistance value that tin oxide is not formed on the plated member surface since the silver-tin alloy layer 4 is not exposed on the outermost surface. Further, since the plating layer includes the hard silver-tin alloy layer 4, even if the silver coating layer 5 is softened by heating, the plating layer as a whole is not softened by heating. As just described, the plated member according to the present invention has high heat resistance.

Here, the silver coating layer 5 is desirably formed thinner than the silver-tin alloy layer 4. This is because an effect of reducing the friction coefficient by forming the soft silver coating layer 5 on the hard silver-tin alloy layer and an effect of preventing softening after being left at high temperature by the presence of the silver-tin alloy layer 4 as described above are not sufficiently exhibited if the silver coating layer 5 is thicker than the silver-tin alloy layer 4.

Further, a thickness of the silver-tin alloy layer 4 is preferably in a range of 1 to 45 μm and that of the silver coating layer 5 is preferably in a range of 0.5 to 15 μm. More preferably, the thickness of the silver-tin alloy layer 4 is in a range of 1 to 9 μm and that of the silver coating layer 5 is in a range of 0.5 to 3 μm. The effect of reducing the friction coefficient is realized by a thickness balance between the silver-tin alloy layer 4 and the silver coating layer 5 and the friction coefficient cannot be sufficiently reduced if either one of them is too thick or thin.

In addition to that, if the silver-tin alloy layer 4 is too thin, none of initial high hardness, the prevention of softening after being left at high temperature and the effect of suppressing a resistance increase is sufficiently exhibited. On the other hand, if the silver-tin alloy layer 4 is too thick, it is difficult to form a silver-tin alloy layer with a uniform composition.

Further, if the silver coating layer 5 is too thin, the effect of suppressing an increase of the surface resistance value after being left at high temperature since tin oxide cannot be formed on the plating layer surface becomes smaller. On the other hand, if the silver coating layer 5 is too thick, the plating layer as a whole is softened by being left at high temperature.

A total thickness of the silver-tin alloy layer 4 and the silver coating layer 5 is desirably in a range of 0.4 to 60 μm. Further, in the case of using the plated member as a terminal for large current, the total thickness is desirably in a range of about 5 to 30 μm.

A friction coefficient in an initial state (before being left at high temperature) of the plated member used as a terminal for large current is desirably not higher than 0.5. According to the plated member having the above configuration, a friction coefficient of not higher than 0.5 is achieved. Further, the hardness of the plated member in the initial state is desirably not lower than 150 in Vickers hardness measured at a load of 1000 mN.

Further, the plated member used as a terminal for large current is required to have a contact resistance increase value of not larger than 1 Ωm measured at a load of 10 N when being left at 150° C. for 120 hr (hereinafter, this condition may be referred to as "left at high temperature").

(Method for Producing Plated Member and Method for Producing Plated Terminal for Connector)

In the plated member producing method according to the present invention, a laminated structure which is composed of a plurality of plating layers and in which silver and tin plating layers are alternately laminated is first produced on a surface of a base material which is copper or copper alloy or copper or copper alloy to which nickel underplating is applied. Subsequently, by heating the laminated structure, a silver-tin alloy layer and a silver coating layer coating the silver-tin alloy layer and exposed on an outermost surface are simultaneously formed. In the above laminated structure, an outermost layer is not the tin plating layer, but the silver plating layer.

FIGS. 1(a) and 1(C) show laminated structures before heating is performed and FIGS. 1(b) and 1(d) show structures of plated members obtained by heating these laminated structures. The laminated structure is composed of three layers in FIG. 1(a) and the laminated structure is composed of four layers in FIG. 1(c).

Tin and silver easily form a stable silver-tin alloy layer. By heating the laminated structure, the tin plating layer is alloyed with a layer therebelow and/or the silver plating layer thereabove to form an Ag4Sn alloy.

Out of the silver plating layer as the outermost layer, excess silver other than that alloyed with the tin plating layer immediately therebelow is left unreacted in the outermost layer and becomes a silver coating layer for coating the silver-tin alloy layer. In the laminated structure, the outermost surface has to be a silver plating layer because the silver coating layer needs to be formed as the outermost layer after heating.

The silver plating layer is desirably made of soft silver. As described above, in the plated member according to the present invention, the silver coating layer formed as the outermost layer preferably has a property as soft silver to achieve a reduction of the friction coefficient. Thus, the silver plating layer forming the laminated structure before heating is desirably also made of soft silver.

By controlling film forming conditions such as a current density of electroplating, the silver plating layer made of not hard silver, but of soft silver can be selectively formed. Further, if elements such as antimony and selenium are contained in plating liquid, diameters of crystal grains forming the silver plating layer become smaller and the hardness of the silver plating layer increases. Thus, the content of these elements is preferably as low as possible. If these elements are contained in the silver-tin alloy layer or the silver coating layer in the produced plated member, they are diffused into the outermost surface to form oxides by being left at high temperature, thereby increasing a contact resistance value. Also in this sense, the laminated structure is desirably formed of the soft silver plating layer containing no elements such as antimony.

As long as the outermost layer is the silver plating layer, a total number of silver and tin plating layers forming the laminated structure is not limited to three or four shown in FIG. 1 and may be any number. However, with an increase in the number of the layers, production cost for the plated member and the plated terminal increases, which is not preferable. Further, if the number of tin and silver plating layers is increased to produce the plated member having a plating layer of a certain predetermined thickness, the film thickness of each plating layer forming the laminated structure becomes smaller and it becomes difficult to control those film thicknesses.

The silver-tin alloy layer can be formed on the base material regardless of whether the lowermost layer, i.e. a layer in contact base material out of the laminated structure is a silver plating layer or a tin plating layer. A case where the lowermost layer is the silver plating layer corresponds to FIG. 1(a) and a case where the lowermost layer is the tin plating layer corresponds to FIG. 1(c).

However, if the base material includes the nickel under plating layer, the nickel under plating layer and the silver-tin alloy layer formed after heating are easily peeled if the lowermost layer of the laminated structure is the tin plating layer. On the other hand, if the lowermost layer of the laminated structure is the silver plating layer, strong adhesion is obtained between the nickel under plating layer and the silver-tin alloy layer formed after heating. In this respect, the lowermost layer of the laminated structure is preferably the silver plating layer.

To maximally reduce the number of the layers of the laminated structure and form the lowermost layer by the silver plating layer, the laminated structure including a total number of three tin and silver plating layers, wherein a lowermost layer is a silver plating layer 21, an intermediate layer is a tin plating layer 31 and an outermost layer is a silver plating layer 22 as shown in FIG. 1(a), is most suitable as the laminated structure when nickel underplating is applied to the base material.

The silver plating layer other than the one as the outermost layer of the laminated structure needs to be completely reacted with the tin plating layer to be alloyed during heating. On the other hand, a part of the silver plating layer as the outermost layer needs to be kept as it is without being alloyed and form the silver coating layer. Thus, the silver plating layer as the outermost layer is preferably thicker than the other silver plating layer(s) (the silver plating layer 21 as the lowermost layer in the case of the above three-layer structure).

Further, since the silver plating layer as the outermost layer needs to form the silver coating layer after heating, it should not be entirely alloyed with the tin plating layer immediately therebelow (tin plating layer 31 as the intermediate layer in the case of the above three-layer structure). Thus, the silver plating layer as the outermost layer is preferably thicker than the tin plating layer immediately therebelow.

Furthermore, if the laminated structure is composed of the silver plating layer 21 as the lowermost layer, the tin plating layer 31 as the intermediate layer and the silver plating layer 22 as the outermost layer as described above, the tin plating layer 31 as the intermediate layer is reacted and alloyed with both the silver plating layer 21 as the lowermost layer and the silver plating layer 22 as the outermost layer. In this case, in order to reliably leave a part of the silver plating layer 22 as the outermost layer as the unreacted silver coating layer 5 after heating, the sum of the thicknesses of the silver plating layer 21 as the lowermost layer and the silver plating layer 22 as the outermost layer is further preferably larger than twice the thickness of the tin plating layer 31 as the intermediate layer.

Even if the thicknesses of the tin and the silver plating layers forming the laminated structure satisfy a relationship as described above, there is a possibility that alloying does not sufficiently proceed in each plating layer during heating if each of the silver and tin plating layers is too thick. Further, if they are too thin, it is difficult to control the film thicknesses. In these respects, preferably, the thickness of the silver plating layer as the outermost layer is in a range of 1 to 30 μm, that of the silver plating layer(s) except the outermost layer is in a range of 0.5 to 15 μm and that of the tin plating layer(s) is in a range of 0.5 to 15 μm. Further preferably, the thickness of the silver plating layer as the outermost layer is in a range of 1 to 4 μm, that of the silver plating layer(s) except the outermost layer is in a range of 0.5 to 3 μm and that of the tin plating layer(s) is in a range of 0.5 to 3 μm.

Here, a thickness relationship of the tin and the silver plating layers is specified in more detail to reliably form the silver-tin alloy during the heating of the laminated structure. It is utilized that a silver plating layer having a thickness of 1.9 reacts in just proportion when a thickness of a tin plating layer is 1.

Figure 2A:
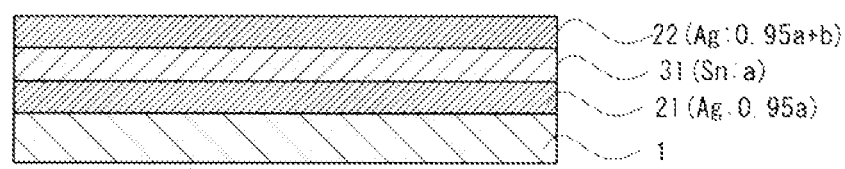
FIGS. 2(a) and 2(b) are schematic diagrams showing a method for determining film thicknesses of silver and tin plating layers in a plated member producing method according to one embodiment of the present invention.
Figure 2A:
Figure 2B:
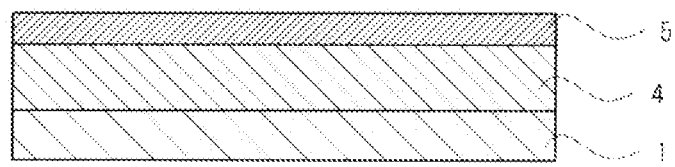

FIG. 2(a) illustrates a method for specifying a film thickness in the case of forming the laminated structure composed of three layers. The thickness of the tin plating layer 31 as the intermediate layer is denoted by a and a desired thickness of the silver coating layer 5 formed on the outermost layer after the laminated structure is heated is denoted by b. The thickness of the silver plating layer that reacts with the tin plating layer 31 having the thickness a in just proportion is 1.9a which is the sum of the thickness of silver derived from the outermost layer 22 and that of silver derived from the lowermost layer 21. If an equal amount of silver is thought to react in each of the outermost layer 22 and the lowermost layer 21, the film thickness of the silver plating layer 21 as the lowermost layer is 1.9a/2=0.95 a. On the other hand, the thickness of the silver plating layer 22 as the outermost layer is added with the thickness of the desired silver coating layer 5, i.e. 0.95a+b. A thickness of the entire laminated structure is 0.95a+a+(0.95a+b)=2.9a+b.

For example, if the thickness a of the tin plating layer 31 of the laminated structure is a=2.0 μm and the thickness b of the desired silver coating layer 5 is b=2.0 μm, the thickness of each layer in the three layer laminated structure is as follows. The thickness of the silver plating layer 21 as the lowermost layer is 1.9 μm, that of the tin plating layer 31 as the intermediate layer is 2.0 μm and that of the silver plating layer 22 as the outermost layer is 3.9 μm. If this is heated, a state is reached where the silver coating layer 5 having a thickness of 2 μm is formed on the silver-tin alloy layer 4 having a thickness of 5.5 μm.

The thickness a of the tin plating layer is preferably in a range of 0.1 to 20 μm. The thickness b of the silver coating layer is preferably in a range of 0.1 to 5 μm. Further, the plated member used as a terminal for large current is preferably such that a is in a range of 5 to 30 μm and b is in a range of 0.5 to 1 μm.

Although not described, a similar concept can be applied also when the laminated structure is composed of four or more layers and the thickness of each of silver and tin plating layers can be specified.

The laminated structure can be easily and inexpensively produced if being continuously formed using a continuous plating line. Since the silver-tin alloy layer and the silver coating layer are formed only by heating this laminated structure, the plated member according to the present invention can be very easily formed in the production process as a whole.

A heating temperature when the silver-tin alloy layer and the silver coating layer are formed by heating the laminated structure composed of tin and silver plating layers is preferably set at about 180° C. to 300° C. Then, a heating time may be appropriately set so that the alloying reaction sufficiently proceeds at the selected heating temperature.

The heating temperature is particularly preferably set at 180° C. or higher and not higher than a melting point (232° C.) of tin. This is because an alloying speed is unlikely to differ depending on the position in the plane of the plating layer and the silver-tin alloy layer with high in-plane uniformity with respect to composition and thickness is formed since, at a temperature lower than the melting point of tin, the alloying reaction slowly proceeds from an interface where the tin plating layer and the silver plating layer is in contact. Further, the interface between the silver-tin alloy layer and the tin coating layer is formed to be smooth. As a result of these, the silver coating layer is also formed with a uniform thickness and the smoothness of the outermost surface is high.

If alloying proceeds too slowly, it takes long time to alloy the entire tin layer and productivity is poor. Thus, a more preferable heating temperature is 200° C. or higher and not higher than the melting point of tin. A possible example of the heating time in the case of heating at 200° C. is 30 min to 1 hr.

In the case of heating at the temperature not lower than the melting point of tin, tin diffuses into the silver plating layer at a high speed to form an alloy. Thus, if a position where tin is locally heated earlier and melted is present in the plane of the plating layer, the alloying reaction quickly proceeds at that position and it becomes difficult to form the silver-tin alloy layer with uniform composition and thickness. Then, the composition and the structure tend to become nonuniform such as due to positions in the plane of the plated member where the silver-tin alloy is formed to be thick or thin, pure tin is left unalloyed and the silver coating layer is thick or thin. As a result, spatial distributions of physical properties such as friction coefficient, hardness, contract resistance and heat resistance are generated in the plane of the plated member. In the case of forming a plurality of plated members, these physical properties largely vary among the plated members. Further, since the melted tin easily diffuses also into the outermost surface, the silver-tin alloy and/or tin is exposed on the outermost surface, which leads to an increase in the contract resistance of the surface. Thus, to form a good laminated structure of a silver-tin alloy layer and a silver coating layer by avoiding these situations in the case of heating at a temperature not lower than the melting point of tin, parameters during heating such as a heating method and a heating time need to be accurately controlled with high reproducibility. For the above reason, heating for alloy formation is preferably performed at a temperature lower than the melting point of tin.

However, if the situations as described above can be avoided by controlling the heating method and the heating time, it is also possible to form the plated member according to the present invention by performing alloy formation at a temperature not lower than the melting point of tin. For example, a heating condition of 1 min at 290° C. can be presented.

As a method for producing a plated terminal for connector according to the present invention, it is possible to form a terminal shape by processing the plated member produced by the above method and to first produce a base material processed into a terminal shape and form a plating layer at least on a part of a terminal surface by the above method.

EXAMPLES

Hereinafter, the embodiment is described in detail using examples.

Example 1

A nickel under plating layer having a thickness of 0.5 μm was formed on a clean surface of a copper base plate. A soft silver plating layer having a target thickness of 1μ was formed on this nickel under plating layer. A tin plating layer having a target thickness of 1μ was formed on this soft silver plating layer, and a soft silver plating layer having a thickness of 2 μm was formed on the tin plating layer. This material was heated at 200° C. for 60 min in the atmosphere, thereby forming a plated member according to Example 1.

Specific formation conditions of the soft silver plating layer and the tin plating layer were as follows.
<Silver Plating Layer>
A plating bath having an Ag concentration of 45 g/L was used
Operating temperature: 30° C.
Current density: 5 ASD (2.5 μm/min)
Plating time: 20 to 30 sec (thickness of plating layer: 1 μm), 40 to 60 sec (thickness of plating layer: 2 μm)
<Tin Plating Layer>
A plating bath having an Sn concentration of 60 g/L was used
Additive: 40 mL/L
Operating temperature: 40° C.
Current density: 5 ASD (2.5 μm/min)
Plating time: 20 to 30 sec (thickness of plating layer: 1 μm)

Example 2

As in Example 1, a plated member in which a soft silver plating layer having a target thickness of 1 μm, a tin plating layer having a target thickness of 1 μm and a soft silver plating layer having a target thickness of 2 μm were successively laminated on a surface of a copper base plate to which nickel plating was applied was heated at 290° C. for 1 min.

Example 3

A plated member in which a soft silver plating layer having a thickness of 1.5 μm, a tin plating layer having a thickness of 1.0 μm and a soft silver plating layer having a thickness of 2.5 μm were successively laminated on a surface of a copper base plate to which nickel plating was applied was heated at 290° C. for 1 min.

Comparative Example 1

A soft silver plating layer having a thickness of 8 μm was formed on a copper base plate formed with a nickel underplating as in Example 1, thereby forming a plated member according to Comparative Example 1.

Comparative Example 2

A silver-tin alloy layer having a thickness of 8 μm was formed on a copper base plate formed with a nickel underplating as in Example 1, thereby forming a plated member according to Comparative Example 2. The silver-tin alloy layer was formed using silver-tin alloy plating liquid (produced by Daiwa Fine Chemicals Co., Ltd., product name "Dain Sister"). An AG concentration was set at 35 g/L and plating was performed for about 30 min under a temperature of 25° C. and a current density of 1 to 2 ASD (0.3 μm/min).

Comparative Example 3

A hard silver plating layer having a thickness of 8 μm was formed on a copper base plate formed with a nickel underplating as in Example 1, thereby forming a plated member according to Comparative Example 3.
Testing Method
(Evaluation of Layer Structure)
To evaluate the layer structures before and after heating in the plated members of Examples 1 to 3, cross-sections of the plated members according to Examples before and after heating were observed using a focused ion beam-scanning ion microscope (FIB-SIM).

(Chemical Compositions of Plating Members after Heating)

To study chemical compositions of constituting layers of the plated members according to Examples 1 to 3 after heating, an Auger electron spectroscopy (AES) measurement was conducted for microscopic areas to estimate existence ratios of elements in the plating layers.

(Evaluation of Grain Diameters of Microcrystals in Silver Coating Layers)

An average grain diameter of microcrystals was estimated as an index for hardness for the silver plating layers of the plated members according to Example 1 and Comparative Example 1. The estimation was conducted by analyzing the obtained FIB-SIM images.

(Evaluation of Friction Coefficient)

A dynamic friction coefficient was evaluated for the plated members of Example 1 and Comparative Example 1. That is, a flat plate-like plated member and an emboss-like plated member having a radium of 3 mm were brought into contact in a vertical direction and held, and the emboss-like plated member was pulled in a horizontal direction at a speed of 10 mm/min and a frictional force acting on a contact portion was measured using a load cell while a load of 5 N was applied in the vertical direction using a piezo actuator. The friction coefficient was obtained by dividing the frictional force by the load.

(Evaluation of Load-Resistance Characteristic)

To estimate a degree of an increase of contact resistance associated with the use of the terminal in a heating environment, a load-resistance characteristic was evaluated. Contract resistance was measured by a four-terminal method for the plated members of Example 1 and Comparative Example 1. At this time, an open voltage was set at 20 mV, an applied current was set at 10 mA, a load applying speed was set at 0.1 mm/min and a load of 0 to 40 N was applied back and forth. Further, a plate-like plated member and an emboss-shaped plated member having a radius of 3 mm were used as electrodes. This load-resistance characteristic was evaluated for the plated members immediately after fabrication. Subsequently, the plated members were left at 150° C. for 120 hr in the atmosphere (hereinafter, this condition may be referred to as "left at high temperature"). After the plated members left at high temperature were cooled to room temperature, the load-resistance characteristic was similarly evaluated. Further, for a contact resistance value at a load of 10 N, an increase value from a value in an initial state (before being left at high temperature) to a value after being left at high temperature was set as a resistance increase value. A similar measurement was conducted for the plated members of Comparative Examples 1 to 3. Here, a load of 10 N is a value approximating a load exerted to a contact portion on a general terminal for large current.

(Evaluation of Hardness Before and after being Left at High Temperature)

A measurement was conducted to study an initial value of the hardness of the plated member according to the present invention and how the hardness changes by the plated member being left at high temperature. The hardness of the plated member according to Example 1 was measured before and after being left at 150° C. for 120 hr in the atmosphere, using a Vickers hardness meter. A similar measurement was conducted for the plated members of Comparative Examples 1 to 3.

Test Result and Considerations (Evaluation of Layer Structures of Plated Members Before Heating)

Figure 3A:
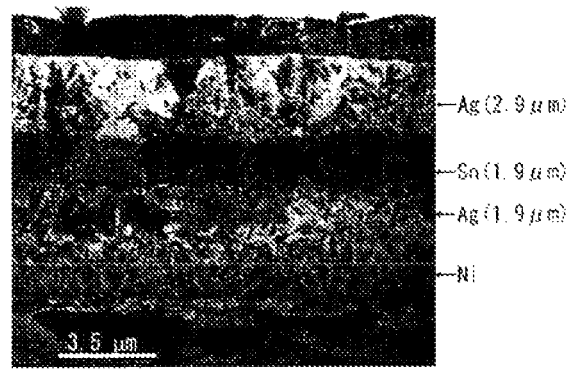

FIG. 3(a) shows an FIB-SIM image of a cross-section of the plated member according to Example 1 before heating. The plating layer is composed of three layers having a thickness of 1.9 µm, 1.9 µm and 2.9 µm from bottom. The respective layers correspond to the silver plating layer, the tin plating layer and the silver plating layer, and there is no progress in alloying and the like and the formed laminated structure is maintained before heating. The thicknesses of these layers substantially match an ideal relationship of the thicknesses of the respective layers derived based on the aforementioned thickness ratio of the tin and silver plating layers at which the alloying reaction proceeds at a proper rate.

The plated member of Example 2 before heating was also formed as in the plated member of Example 1 and a similar laminated structure was observed. Further, it was confirmed in the plated member of Example 3 that a silver plating layer having a thickness of 1.5 µm, a tin plating layer having a thickness of 1.0 µm and a silver plating layer having a thickness of 2.5 µm were laminated from bottom. This corresponds to a state where the tin plating layer is thin as compared with the thickness ratio of the tin and silver plating layers at which the alloying reaction proceeds at a proper rate.

(Evaluation and Chemical Composition of Layer Structure of Plated Member after Heating)

Figure 3B:
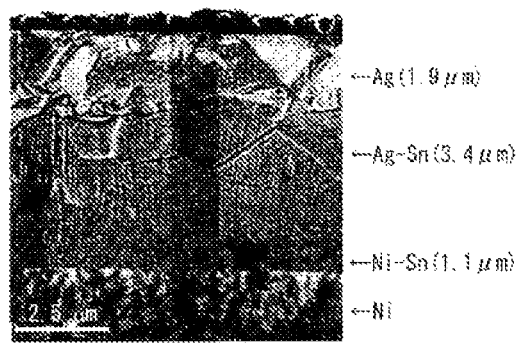

FIG. 3(b) shows an FIB-SIM image of a cross-section of the plated member according to Example 1 after heating. The configuration of the layer structure of the cross-section is largely different from that before heating. Layers having a thickness of 1.1 µm, 3.4 µm and 1.9 µm are formed from bottom. Also in accordance with an analysis result of chemical composition shown later, the intermediate layer having a thickness of 3.4 µm and accounting for a largest proportion is a silver-tin alloy layer. The layer having a thickness of 1.9 µm on the outermost surface is a silver coating layer made of silver. A clear interface is formed between the silver-tin alloy layer and the silver coating layer. Further, the lowermost layer having a thickness of 1.1 µm is made of a nickel-tin alloy according to the result of chemical composition analysis. A clear interface is also formed between the nickel-tin alloy layer and the silver-tin alloy layer. The nickel-tin alloy layer and the silver-tin alloy layer strongly adhere to each other at the interface.

When an AES measurement was conducted at a position where the silver-tin alloy layer was present in FIG. 3(b), only a peak of Ag and a peak of Sn were observed except peaks derived from small amounts of impurities. When the amount of existence of each of these elements in all the existent elements was calculated by normalizing peak intensities of silver and tin by an Auger electron emission cross-sectional area, the amount of existence of silver was 79.7% and that of tin was 20.3%. That is, Ag:Sn=4:1. This revealed that the silver-tin alloy layer was made of a silver-tin alloy having the composition of Ag4Sn.

A composition generally known as a silver-tin alloy is Ag3Sn. The alloy having the composition of Ag4Sn observed in the plated member of Example 1 is also reported in an X-ray diffraction database and the stable silver-tin alloy layer is thought to be formed by heating the laminated structure of the silver and tin plating layers.

On the other hand, when the AES measurement was conducted also for the uppermost layer, only a peak of Ag was observed and it was found that the uppermost layer was a coating layer made of silver. Further, when the AES measurement was conducted also for the lowermost layer, it was revealed that a silver-nickel layer was formed in this layer.

Figure 4A:
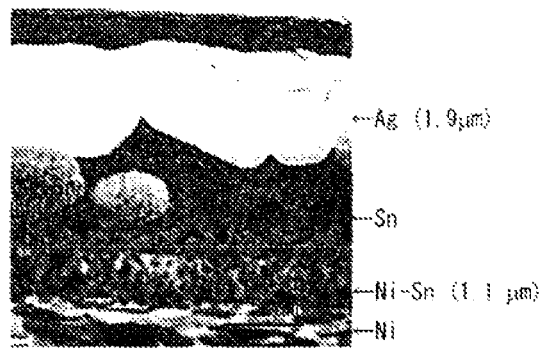
FIGS. 4(a) and 4(b) show FIB-SIM images of cross-sections of plated members according to Example 2 and Example 3.
Figure 4B:
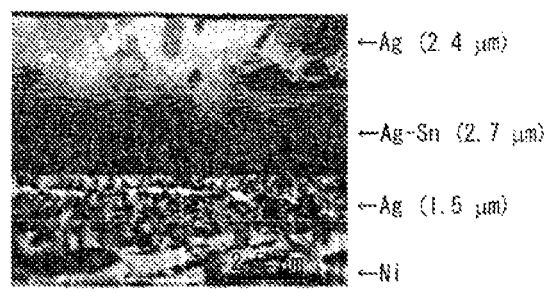

Next, FIB-SIM images of cross-sections of the plated members according to Examples 2 and 3 after heating are shown in FIGS. 4(a) and 4(b). Unlike the plated member of Example 1, a laminated structure including flat layer interfaces is not formed in the plated member of Example 2. The configuration of each layer is shown together with the result of composition analysis. A nickel-tin alloy (Ni3Sn2) layer having a thickness of 1.1 μm is formed on a nickel underlayer and a tin layer having a thickness of about 2 μm is formed on the nickel-tin alloy layer. In this tin layer, grained domains having a grain diameter of about 0.5 to 2 μm and made of another substance are seen, but these are made of a silver-tin alloy. A silver coating layer having an average thickness of 1.9 μm is formed on this layer in which tin and the silver-tin alloy are mixedly present.

In the plated member of Example 3 in FIG. 4(b), a silver layer having a thickness of 1.5 μm, a silver-tin alloy (Ag4Sn) layer having a thickness of 2.7 μm and a silver layer having a thickness of 2.4 μm are successively formed on a nickel underlayer. An interface of each layer is relatively flat and each layer has high thickness uniformity.

The configuration of the laminated structure of the tin and silver plating layers before heating is the same, but the heating time and the heating temperature are different between Examples 1 and 2. Since the alloying reaction slowly proceeded at a temperature not higher than the melting point of tin in Example 1, a uniform configuration was present in the plane of the plated member and layer interfaces were formed to be smooth. On the other hand, since the alloying reaction quickly proceeded at a temperature not lower than the melting point of tin in Example 2, the uniform silver-tin alloy was not formed and parts made of tin and parts made of the silver-tin alloy were mixedly present. In addition, the thickness of the silver coating layer was not uniform and the interface of each layer and the outermost surface of the silver coating layer were also not smooth.

As just described, in Example 2, the parts made of unalloyed tin were formed. To avoid such a state, a proportion of the silver plating layer to the tin plating layer before heating was increased as compared with Example 2 and the same heating temperature and heating time as in Example 2 were applied in Example 3. Then, a silver-tin alloy layer with a uniform thickness was formed due to a large proportion of silver, but excess silver remained at the interface between the nickel underlayer and the silver-tin alloy layer.

The above mutual comparison of Examples 1 to 3 found it preferable to heat a laminated structure of silver and tin plating layers at a temperature not higher than the melting point of tin for a long time in order to form a spatially uniform silver-tin alloy layer having a smooth interface with a silver coating layer and cause alloying to proceed at a proper rate.

(Evaluation of Grain Diameters of Microcrystals in Silver Coating Layer)

Figure 3C:
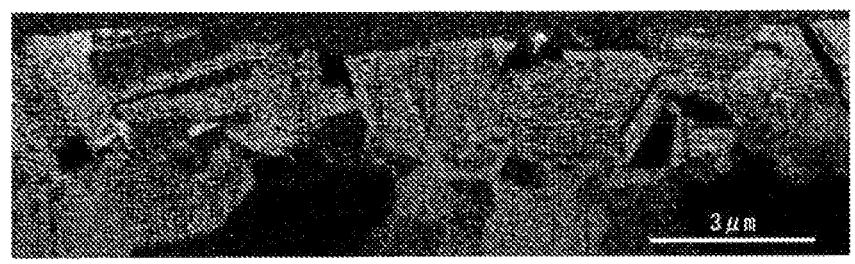

FIG. 3(c) shows an enlarged and observed FIB-SIM image of a position in the silver coating layer of the plated member of Example 1 obtained after heating. Looking at this image, the silver coating layer is found to be an aggregate of coarse crystal grains.

Further, grain diameters of microcrystals were quantitatively evaluated based on the image of FIG. 3(c). That is, the number of microcrystals crossed by a straight line of a certain length drawn in the image was counted and an average grain diameter of the microcrystals was calculated by dividing the length of the straight line by the number of the microcrystals. As a result, the average grain diameter of the microcrystals was 1.67 μm.

There is a strong correlation between grain diameters and hardness of silver microcrystals. As the grain diameters of the silver microcrystals constituting the plating layer increases, the plating layer becomes softer. Accordingly, for comparison with the crystal grain diameters in the above plated member according to Example 1, an average diameter of silver fine particles was similarly estimated for a cross-section of the soft silver plating layer according to Comparative Example 1. An average grain diameter of silver microcrystals was 0.89 μm. Since the grain diameter of the silver microcrystals of 1.67 μm in Example 1 is larger than the grain diameter of the silver microcrystals of this soft silver plating layer, the silver coating layer is concluded to be made of soft silver in the plated member of Example 1.

(Evaluation of Friction Coefficient)

TABLE-1 shows a measurement result on the friction coefficient for the plated members according to Example 1 and Comparative Examples.

TABLE 1

|  | Exa. 1 (Ag/Ag—Sn) | C. Exa. 1 (Soft Ag) | C. Exa. 2 (Ag—Sn) | C. Exa. 3 (Hard Ag) |
| --- | --- | --- | --- | --- |
| Friction Coefficient | 0.5 | 0.9 | 0.3 | 0.3 |

A friction coefficient of about 0.5 was observed for the plated member of Example 1. On the other hand, a friction coefficient of as high as 0.9 was observed for the plated member of Comparative Example 1 made of soft silver. That is, the friction coefficient is smaller in the plated member according to the present invention in which the soft silver plating layer was formed on the silver-tin alloy layer than when only the soft silver plating layer was formed on the nickel underplating.

The friction coefficient was similarly measured for the plated member of Comparative Example 2 in which the silver-tin alloy is formed on the outermost surface and the plated member of Comparative Example 3 in which only the hard silver plating layer was formed. The friction coefficient of the plated member in which the silver-tin alloy is formed on the outermost surface was 0.3, and that of the plated member in which only the hard silver plating layer was formed was also 0.3. Although the friction coefficient of the plated member according to Example 1 is larger than these friction coefficients, it satisfies a friction coefficient criterion of not higher than 0.5 required for a plated member constituting a terminal for large current.

(Evaluation of Load-Resistance Characteristic)

TABLE-2 shows contact resistance values and increase values of the plated members according to Example 1 and Comparative Example 2, in which the silver-tin alloy was exposed on the outermost surface, measured at a load of 10 N before and after being left at high temperature.

TABLE 2

|  | Exa. 1 (Ag/Ag—Sn) | C. Exa. 2 (Ag—Sn) |
| --- | --- | --- |
| Initial Contact Resistance | 0.45 | 1.1 |
| Contact Resistance After Being Left at High Temperature | 0.83 | >10 |
| Resistance Increase Value | 0.38 | >8 |

(Unit: mΩ)

The contact resistance value of the plated member of Example 1 is smaller than that of the plated member of Comparative Example 2 both before and after being left at high temperature. Particularly, after being left at high temperature, the contact resistance value increases beyond a measurement limit in Comparative Example 2, whereas it remains to be a small value in Example 1.

A resistance increase value after being left at high temperature is not larger than 0.5 mΩ in the case of Example 1, whereas it is 8 mΩ or larger in the case of Comparative Example 2. That is, an increase of the contact resistance caused by being left at high temperature is suppressed to 1/10 or less by coating the silver-tin alloy layer with the silver coating layer. This is understood to be because the presence of the silver coating layer prevents tin constituting the silver-tin alloy layer from being oxidized on the outermost surface and increasing the resistance value.

An increase value of the contact resistance caused by being left at high temperature was similarly evaluated for the plated member of Comparative Example 1 in which only the soft silver plating layer was formed and the plated member of Comparative Example 3 in which only the hard silver plating layer was formed. As a result, the resistance increase value measured at a load of 10 N was 0 mΩ (not higher than a detection limit) for the plated member in which only the soft silver plating layer was formed and 10 mΩ or larger for the plated member in which only the hard silver plating layer was formed. This is thought to be because antimony was added in the hard silver plating layer, copper of the base material and antimony diffused into the outermost surface and were oxidized to largely increase resistance when being left at high temperature. The formation of such oxides did not occur in the soft silver plating layer as in the case of Example of the present invention.

(Evaluation of Hardness Before and after being Left at High Temperature)

A Vickers hardness was measured for the plated member of Example 1 before and after being left at high temperature. At a test load of 1000 mN, the Vickers hardness of the plated member in an initial state (before being left at high temperature) was 155 Hv.

On the other hand, the Vickers hardness after being left at high temperature was 190 Hv. That is, the Vickers hardness had increased from that in the initial state by being left at high temperature. By this reason, it was revealed that the plated member according to the present invention was not softened by being left at high temperature. Rather, the occurrence of softening is thought to be because the alloying of parts of tin and silver left unreacted proceeded by being left at high temperature.

(Summary)

It was revealed that the plated member including the silver-tin alloy layer and the silver coating layer was formed by alternatively laminating the silver and tin plating layers with the outermost layer formed by the silver plating layer and heating these layers.

The contact resistance increase values by being left at high temperature, the Vickers hardness, the friction coefficients before and after being left at high temperature and the behavior of the hardness after being left at high temperature obtained for the plated members of Example 1 and Comparative Examples 1 to 3 by the above tests are summarized in TABLE-3 together with desired values as a plated member constituting a terminal for large current.

TABLE 3

|  | Target Value of Terminal for large Current | Exa. 1 (Ag/Ag—Sn) | C. Exa. 1 (Soft Ag) | C. Exa. 2 (Ag—Sn) | C. Exa. 3 (Hard Ag) |
|---|---|---|---|---|---|
| Resistance Increase after Being Left at High Temperature | 1 mΩ or smaller | 0.2 mΩ | 0 mΩ | 5 mΩ or larger | 10 mΩ or larger |
| Vickers Hardness | 150 or higher | 150 | 100 | 200 | 200 |
| Friction Coefficient | 0.5 or lower | 0.5 | 0.9 | 0.3 | 0.3 |
| Hardness after Being Left at High Temperature | No fall | No fall | No fall | No fall | Fall |

Since the outermost surface is coated with soft silver having high purity in Example 1 according to the present invention, an increase of the resistance value caused by being left at high temperature is suppressed as in the case of Comparative Example 1 in which only the soft silver plating is formed. This is unlike Comparative Examples 2 and 3 in which tin oxide, antimony oxide and copper oxide were formed on the outermost surface by being left at high temperature to increase surface resistance. The plated member of the present invention acquires high heat resistance by having such a small resistance increase value.

The plated member of Example 1 has a high Vickers hardness by including the very hard silver-tin alloy layer thicker than the silver coating layer made of very soft silver although this silver coating layer is included in the structure. Further, the hardness of the plated member of Example 1 is not reduced even after being left at high temperature. Thus, this plated member has high heat resistance also in terms of maintaining the hardness.

Further, a low friction coefficient is achieved in the plated member of the present invention since the hard silver-tin alloy layer is formed below the outermost surface although the outermost surface is formed by the soft silver exhibiting a high friction coefficient alone.

Out of four plated members, only the plated member according to Example 1 satisfies all of the resistance increase value, the Vickers hardness, the friction coefficient and the behavior of the hardness after being left at high temperature required for a plated member constituting a terminal for large current. That is, the plated member of the present invention is excellent as a material of a terminal for large current.

The invention claimed is:

1. A plated member, comprising:
    a base material made of copper or copper alloy;
    a silver-tin alloy layer coated on a surface of the base material; and
    a silver coating layer coated on a surface of the silver-tin alloy layer so that the silver coating layer is exposed on an outermost surface, the silver coating layer being thinner than the silver-tin alloy layer;

wherein the plated member has a friction coefficient of not higher than 0.5.

2. The plated member of claim 1, further comprising an underplating made of nickel or copper formed in contact with the surface of the base material, and the silver-tin alloy layer being formed on a surface of the underplating.

3. The plated member of claim 1, wherein a thickness of the silver-tin alloy layer is in a range of 1 to 45 μm and a thickness of the silver coating layer is in a range of 0.5 to 15 μm.

4. A plated terminal for connector, comprising the plated member of claim 1.

5. The plated member of claim 1, wherein the silver-tin alloy layer has a main phase that is $Ag_4Sn$.

6. A plated member, comprising:
a base material made of copper or copper alloy;
a silver-tin alloy layer coated on a surface of the base material, the silver-tin alloy layer having a main phase that is $Ag_4Sn$; and
a silver coating layer coated on a surface of the silver-tin alloy layer so that the silver coating layer is exposed on an outermost surface, the silver coating layer being thinner than the silver-tin alloy layer.

* * * * *